United States Patent
Chiola

(10) Patent No.: US 7,323,402 B2
(45) Date of Patent: Jan. 29, 2008

(54) TRENCH SCHOTTKY BARRIER DIODE WITH DIFFERENTIAL OXIDE THICKNESS

(75) Inventor: Davide Chiola, Marina del Rey, CA (US)

(73) Assignee: International Rectifier Corporation, El Segundo, CA (US)

( * ) Notice: Subject to any disclaimer, the term of this patent is extended or adjusted under 35 U.S.C. 154(b) by 347 days.

(21) Appl. No.: 11/035,582

(22) Filed: Jan. 14, 2005

(65) Prior Publication Data
US 2005/0127465 A1    Jun. 16, 2005

Related U.S. Application Data

(63) Continuation-in-part of application No. 10/193,783, filed on Jul. 11, 2002, now Pat. No. 6,855,593.

(51) Int. Cl.
*H01L 21/28* (2006.01)
*H01L 21/44* (2006.01)

(52) U.S. Cl. ............ 438/576; 438/237; 438/582; 438/583; 438/963; 257/E29.195; 257/E29.338; 257/E21.359; 257/E21.368

(58) Field of Classification Search ........... 438/237, 438/576, 582, 583, 963, 534, FOR. 173, 438/FOR. 335, FOR. 415; 257/E29.195, 257/E29.338, E21.359, E21.368
See application file for complete search history.

(56) References Cited

U.S. PATENT DOCUMENTS

| | | | |
|---|---|---|---|
| 3,363,153 A | 1/1968 | Zloczower | 317/235 |
| 4,219,835 A | 8/1980 | van Loon et al. | 357/55 |
| 4,646,115 A | 2/1987 | Shannon et al. | 357/15 |
| 4,647,957 A | 3/1987 | Coquin et al. | 257/374 |
| 4,992,390 A * | 2/1991 | Chang | 438/270 |
| 4,994,883 A | 2/1991 | Chang et al. | 357/38 |
| 5,082,795 A * | 1/1992 | Temple | 438/138 |
| 5,365,102 A | 11/1994 | Mehrotra et al. | 257/475 |
| 5,612,567 A | 3/1997 | Baliga | 257/475 |
| 5,888,880 A * | 3/1999 | Gardner et al. | 438/424 |
| 6,049,108 A * | 4/2000 | Williams et al. | 257/341 |
| 6,078,090 A * | 6/2000 | Williams et al. | 257/476 |
| 6,236,099 B1 | 5/2001 | Boden, Jr. | 257/495 |
| 6,262,453 B1 * | 7/2001 | Hshieh | 257/341 |
| 6,437,386 B1 * | 8/2002 | Hurst et al. | 257/301 |
| 6,441,454 B2 * | 8/2002 | Hijzen et al. | 257/483 |
| 6,466,634 B1 | 10/2002 | O'Toole et al. | 375/374 |

(Continued)

Primary Examiner—George R. Fourson
Assistant Examiner—John M. Parker
(74) Attorney, Agent, or Firm—Ostrolenk, Faber, Gerb & Soffen, LLP

(57) ABSTRACT

A fabrication process for a trench Schottky diode with differential oxide thickness within the trenches includes forming a first nitride layer on a substrate surface and subsequently forming a plurality of trenches in the substrate including, possibly, a termination trench. Following a sacrificial oxide layer formation and removal, sidewall and bottom surfaces of the trenches are oxidized. A second nitride layer is then applied to the substrate and etched such that the second nitride layer covers the oxide layer on the trench sidewalls but exposes the oxide layer on the trench bottom surfaces. The trench bottom surfaces are then re-oxidized and the remaining second nitride layer then removed from the sidewalls, resulting in an oxide layer of varying thickness being formed on the sidewall and bottom surfaces of each trench. The trenches are then filled with a P type polysilicon, the first nitride layer removed, and a Schottky barrier metal applied to the substrate surface.

17 Claims, 13 Drawing Sheets

U.S. PATENT DOCUMENTS

| | | | |
|---|---|---|---|
| 6,541,312 B2 | 4/2003 | Cleeves et al. | 438/131 |
| 6,580,123 B2 * | 6/2003 | Thapar | 257/330 |
| 6,709,930 B2 * | 3/2004 | Chan et al. | 438/270 |
| 6,710,418 B1 * | 3/2004 | Sapp | 257/471 |
| 6,861,296 B2 * | 3/2005 | Hurst et al. | 438/138 |
| 6,921,699 B2 * | 7/2005 | Ma et al. | 438/270 |
| 2001/0006831 A1 * | 7/2001 | Luo | 438/138 |
| 2003/0010144 A1 | 1/2003 | Petzold | 74/335 |

* cited by examiner

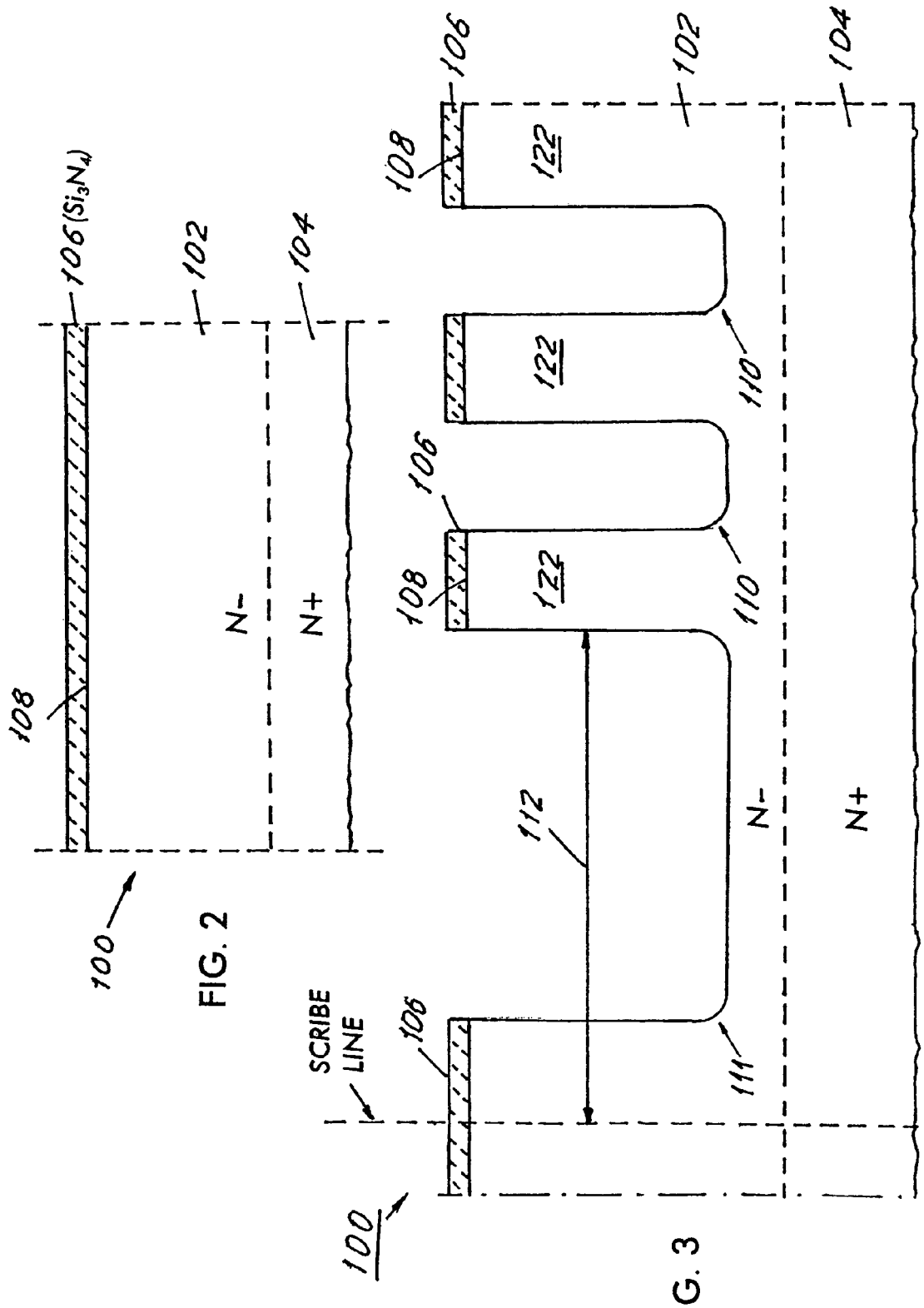

TRENCH SCHOTTKY BARRIER DIODE WITH DIFFERENTIAL OXIDE THICKNESS

RELATED APPLICATIONS

This application is a continuation-in-part of and claims priority to U.S. application Ser. No. 10/193,783, filed Jul. 11, 2002, now U.S. Pat. No. 6,855,593 entitled, "Trench Schottky Barrier Diode," by Kohji Andoh and Davide Chiola, the contents of which are herein incorporated by reference.

BACKGROUND OF THE INVENTION

1. Field of the Invention

The present invention relates to semiconductor devices and more particularly, to a trench Schottky diode with differential oxide thickness and a process for fabricating such a device.

2. Discussion of the Related Art

Schottky diodes are well known and are made with different topologies, including a trench topology as typically shown in U.S. Pat. No. 5,612,567 by Bantval Baliga. The process for manufacturing a trench Schottky diode requires a large number of mask layers and manufacturing steps. However, U.S. patent application Ser. No. 10/193,783, by the present inventor, presented an inventive process for fabricating trench Schottky diodes in which a reduced number of steps and fewer mask layers are required.

Referring to the Figures, in which like reference numerals refer to like elements, there is shown in FIG. 1 an example trench Schottky diode fabricated according to the process of the aforementioned application, FIG. 1 being a reproduction of FIG. 11 of that application. As seen, the device of FIG. 1 includes a silicon wafer 10 with a plurality of mesas 54 separating a plurality of trenches 30, including a termination trench region 60. A thin uniform oxide layer ($SiO_2$) 44 lines the sidewall and bottom surfaces of each trench 30 and termination region 60, forming gate oxides and a termination oxide, respectively. A P type polysilicon 48 fills each trench 30 thereby forming a plurality of electrodes that under reverse bias, reduce reverse biased leakage currents and increase the reversed bias blocking voltage. A Schottky barrier metal 50 covers the active region, forming Schottky contacts 52 that extend over the tops of the mesa regions 54. Finally, anode electrode 56 and a cathode electrode (not shown) extend over the top and bottom surfaces, respectively, of the device.

In a trench Schottky device, such as that shown in the example device of FIG. 1, the oxide layer is formed simultaneously along the sidewall and bottom surfaces of each trench 30 and termination region 60 and thereby has the same uniform thickness throughout. However, the oxide layer along the sidewall and bottom surfaces of the trenches and termination region accomplish different purposes. More specifically, depending on the thickness of the oxide layer in each of these regions, the electrical and structural characteristics of the resulting device are affected in different ways.

For example, the gate oxide on the bottom surface of each trench 30 serves to screen the high electric field regions located at the trench bottom corners. In general, the higher the oxide thickness in this critical region, the higher the reverse breakdown voltage the device can sustain. Accordingly, a thicker gate oxide is desired along the bottom surface of the trenches.

On the contrary, the gate oxide grown on the sidewall of each trench 30 mainly affects the pinch-off characteristics of the reversed bias leakage current. Specifically, during reverse bias, the oxide on the sidewall of a trench serves to transfer the anode voltage from the trench electrode to the mesa region 54. However, part of the negative anode voltage is dropped in the oxide, with the balance of the voltage serving as the pinch-off voltage for the mesa conductive region.

Accordingly, a thin gate oxide thickness is desired along the trench sidewall in order to minimize the voltage dropped in the oxide and allow a reduced reverse biased leakage pinch-off voltage. In addition, a thin oxide thickness along the trench sidewall means less silicon is consumed during the oxidation process, thereby increasing the conduction area in the mesa regions 54. As is known, an increased mesa region means a higher active area, which is beneficial towards reducing the forward voltage drop of the device during forward conduction.

As for the termination oxide in termination region 60, it serves several purposes. From an electrical perspective, the oxide along the bottom surface of the region serves as a field oxide for the field plate termination. In general, it is desirable to have this field oxide thick enough to minimize the electric field crowding that occurs in the oxide underneath the edge 58 of the metal field plate and that is responsible for breakdown voltage walk-out. From a mechanical perspective, this portion of the field oxide underneath the edge of the metal field plate experiences high stress during temperature cycle reliability tests of the packaged device. Again, a thicker field oxide is desirable to avoid oxide rupture under the edge of the field plate during these tests.

As seen, it is disadvantageous to use the same oxide thickness across all regions of the trench Schottky device. In particular, it is desirable to have the oxide layer that lines the sidewalls of the trenches and termination region thinner than the oxide layer that lines the bottom surfaces of these trenches.

Nonetheless, it should also be noted that others have disclosed trench type devices that use a gate oxide of variable thickness; in particular, U.S. Pat. No. 6,236,099 by Milton Boden and U.S. Pat. No. 6,580,123 by Naresh Thapar disclose such devices. However, both patents are directed at MOSgated devices, including MOSFETs and IGBTS, and not at trench Schottky devices. In addition, these patents only teach the use of a variable gate oxide and not the use of a variable termination oxide.

The process by which Thapar forms the variable gate oxide should also be noted. In particular, this process includes first depositing a silicon nitride layer on the trench sidewall and bottom surfaces. The nitride layer at the bottom surface is then etched away and an oxide layer grown thereupon to a desired thickness. The nitride layer on the trench sidewall is then removed and a subsequent oxide layer is grown on the sidewall to a desired thickness.

BRIEF SUMMARY OF THE INVENTION

Accordingly, it would be desirable to produce a trench Schottky diode that has differential or varying oxide thickness in different regions of the device, thereby overcoming the above and other disadvantages of the prior art. In accordance with the present invention, a novel fabrication process is employed for the manufacture of an inventive trench Schottky diode that has differential oxide thickness and more particularly, that has an oxide layer along the sidewall of each trench that is thinner than the oxide layer along the trench bottom surfaces.

Specifically, in accordance with the present invention, a first silicon nitride layer is initially deposited directly on a surface of a silicon substrate. During a trench mask and etching step, a plurality of mesas and trenches are then formed in the surface of the substrate. This step may also include the formation of a termination trench. Once the trenches and termination trench are formed, a sacrificial oxide is grown on the sidewall and bottom surfaces of these trenches. This sacrificial oxide is then stripped. Next, a gate and termination oxide are grown on the sidewall and bottom surfaces of the trenches and termination trench, respectively, such that the sacrificial oxide thickness to the gate/termination oxide thickness is preferably at a ratio of 2:1. A second nitride layer is then deposited over the sidewall and bottom surfaces of these trenches and over the first nitride layer that remains on the substrate surface. This second nitride layer is then dry etched, once again exposing the first nitride layer and more importantly, exposing the oxide layer along the bottom surface of the trenches. However, the oxide layer along the sidewall of the trenches remains covered. Accordingly, the bottom surface of the trenches are then once again oxidized. Following this second oxidation, the second nitride layer is then stripped during a wet etch from the sidewall of the trenches. As a result, in accordance with the present invention, an oxide layer is formed on the sidewall of each of the trenches and the termination trench that is thinner than the oxide layer formed on the bottom surfaces of these trenches.

Once the second nitride layer is removed, the trenches are next filled with a P type polysilicon. The remaining first nitride layer is then stripped in a wet etch. Next, a Schottky metal layer is deposited over the active surface of the substrate forming a Schottky rectifier contact with the plurality of mesas. Finally, anode and cathode electrodes are formed on opposite surfaces of the substrate.

As such, according to the present invention, a novel trench Schottky diode that has differential oxide thickness is formed, wherein the oxide layer on the sidewalls of the trenches and the termination trench is thinner than the oxide layer along the trench bottom surfaces.

BRIEF DESCRIPTION OF THE DRAWINGS

FIG. 2 shows a cross-section of a silicon wafer after the formation of a first nitride layer directly on the silicon substrate surface.

FIG. 3 shows the structure of FIG. 2 after the first nitride layer and substrate are masked and dry etched, resulting in the formation of a set of trenches, including a termination trench.

DETAILED DESCRIPTION OF THE INVENTION

Figure 1:
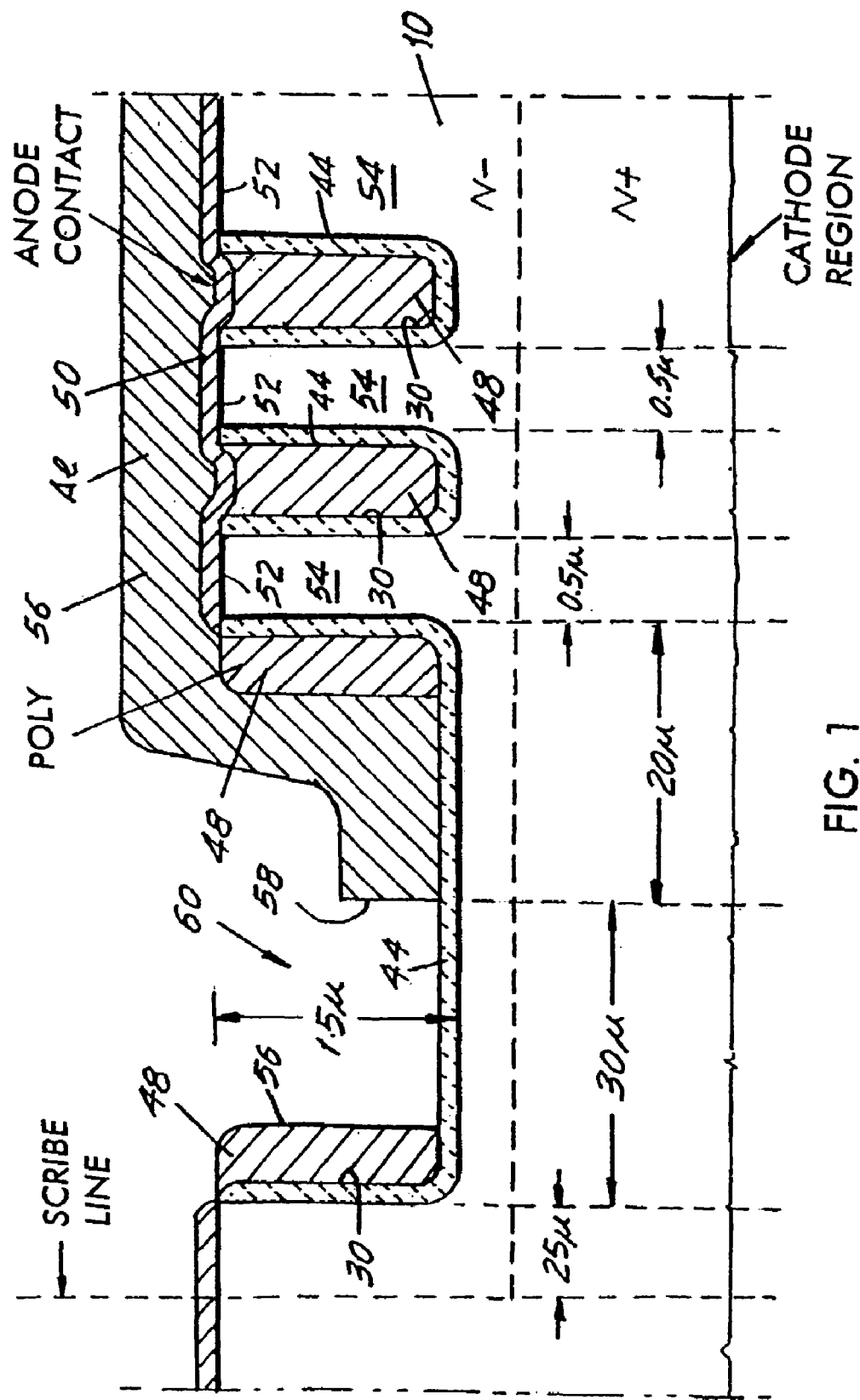
FIG. 1 shows a cross-section of a trench Schottky diode that has uniform oxide thickness along the sidewall and bottom surfaces of the trenches, including a termination trench.

Referring now to FIGS. 2-14 (note that the Figures are not drawn to scale), a fabrication process and a resulting device structure for a trench Schottky diode that has differential or varying oxide thickness along trench sidewall and bottom surfaces is illustrated. The process is a modification of the two mask process presented in application Ser. No. 10/193,783. However, by varying the thickness of the oxide layer along the trench sidewall and bottom surfaces according to the present invention, a device is formed that has improved reverse breakdown voltage and that is less susceptible to temperature cycles. Note that the process described here is for a low voltage Schottky device rated at 15-45V. However, one skilled in the art will recognize that with suitable changes, the described process applies to any device rating.

Beginning with FIG. 2, an initial silicon wafer 100 is shown having an N+ substrate 104 with an N− epitaxially grown upper surface 102 (epi layer). As an example, wafer 100 can have a silicon thickness ranging from 2.5 um to approximately 4 um with a resistivity between 0.3 and 0.5 ohm cm; however, other silicon thickness and resistivity can be used. Wafer 100 is initially cleaned using, for example, hydroflouric (HF) acid, which removes thermal and native oxides.

Once cleansed, a removable surface nitride layer ($Si_3Ni_4$) 106 is directly deposited at a thickness of approximately 600-800 Å on the surface 108 of the epi layer 102 using a low-pressure chemical vapor deposition technique (LPCVD). Note that nitride layer 106 is deposited without first forming a pad oxidation layer.

In order to form spaced trenches, a layer of photoresist and a mask with a desired trench pattern (step not shown) are next applied to the surface of nitride layer 106. The resulting structure is then patterned using a suitable photolithographic process.

Next, using a suitable etching process, such as plasma etching, nitride layer 106 and epi layer 102 are etched to form a plurality of trenches 110 and mesas 122, as shown in FIG. 3. The trenches extend through nitride layer 106 and extend downwardly from the top side 108 of epi layer 102 and into the epi layer. As an example, the trenches can be arranged in parallel spaced stripes and can have a width of about 0.5 microns, a spacing of about 0.5 microns, and a depth of 1.5 microns. Nonetheless, other trench formations and dimensions can be utilized.

As shown in FIG. 3, during this process of forming trenches 110, a termination trench 111 can also be formed, thereby forming a termination trench region, as shown by arrow 112. Nonetheless, one skilled in the art will recognize that the present invention also applies to trench Schottky devices that do not include a termination trench region (for discussion purposes, the formation of a termination region will be assumed).

Once trenches 110 and 111 are formed, the remaining portion of the photoresist mask is stripped, and the exposed surfaces of the trenches undergo a pre-diffusion cleaning step.

Figure 4:
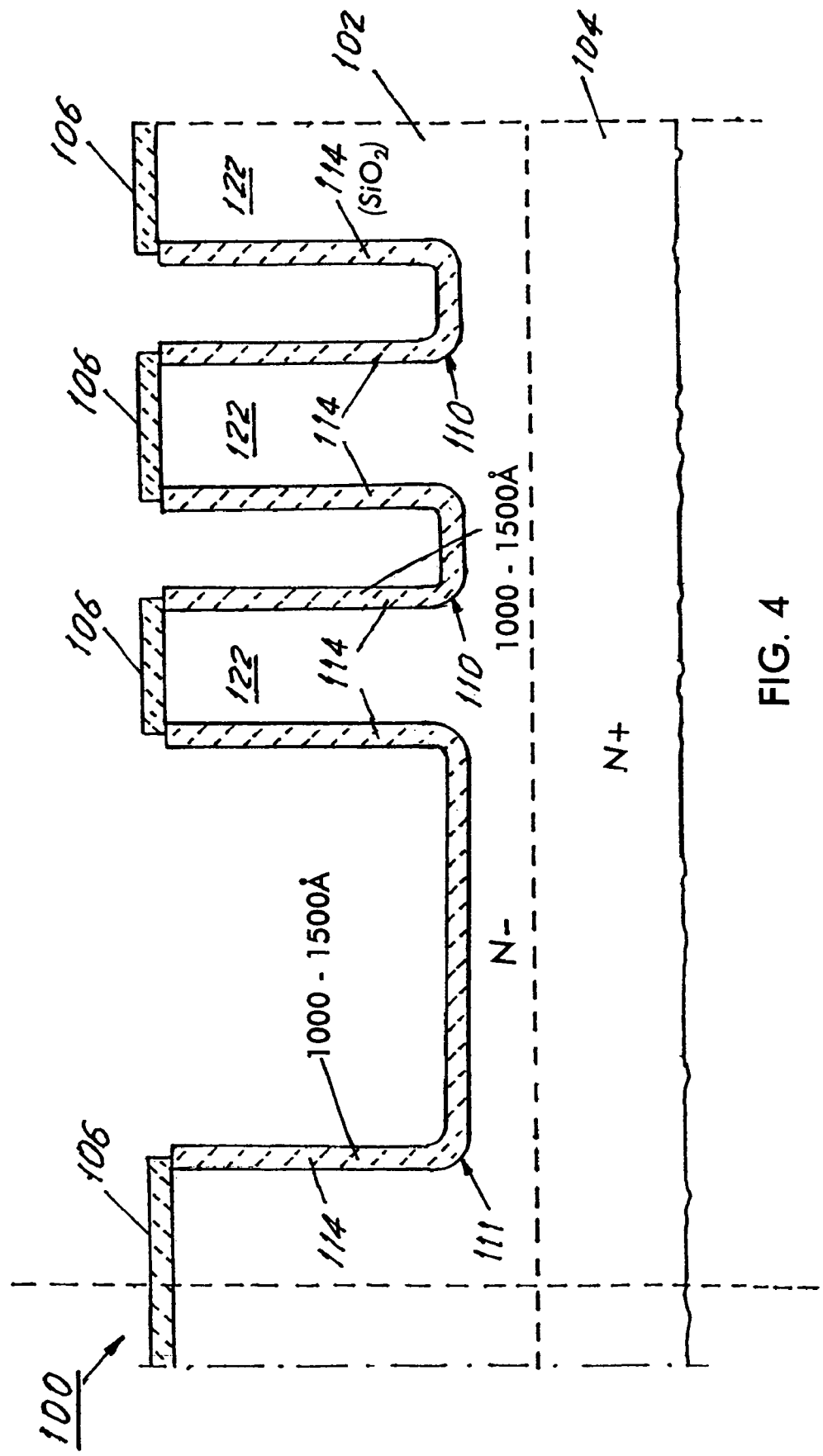
FIG. 4 shows the structure of FIG. 3 after the growth of a sacrificial oxide layer along the sidewall and bottom surfaces of the trenches.
Figure 5:
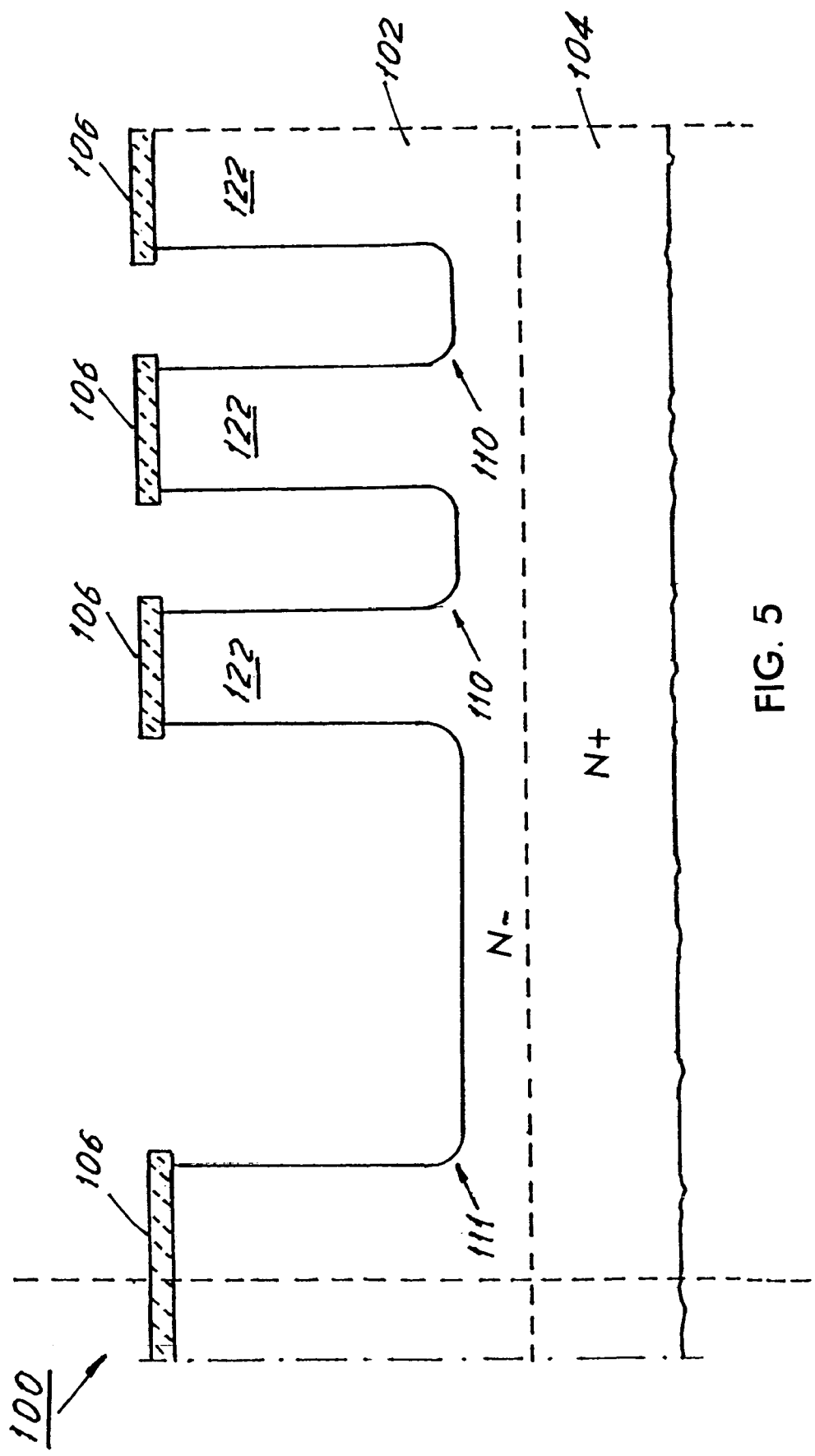
FIG. 5 shows the structure of FIG. 4 after the removal of the sacrificial oxide layer.

Turning to FIG. 4, a sacrificial oxide layer ($SiO_2$) 114 having a thickness of approximately 1000-1500 Å is next simultaneously grown on the sidewall and bottom surfaces of each trench 110 and 111. A sacrificial oxide etch at a target depth of approximately 1500-2000 Å is then performed to completely remove this oxide layer, as shown in FIG. 5.

Figure 6:
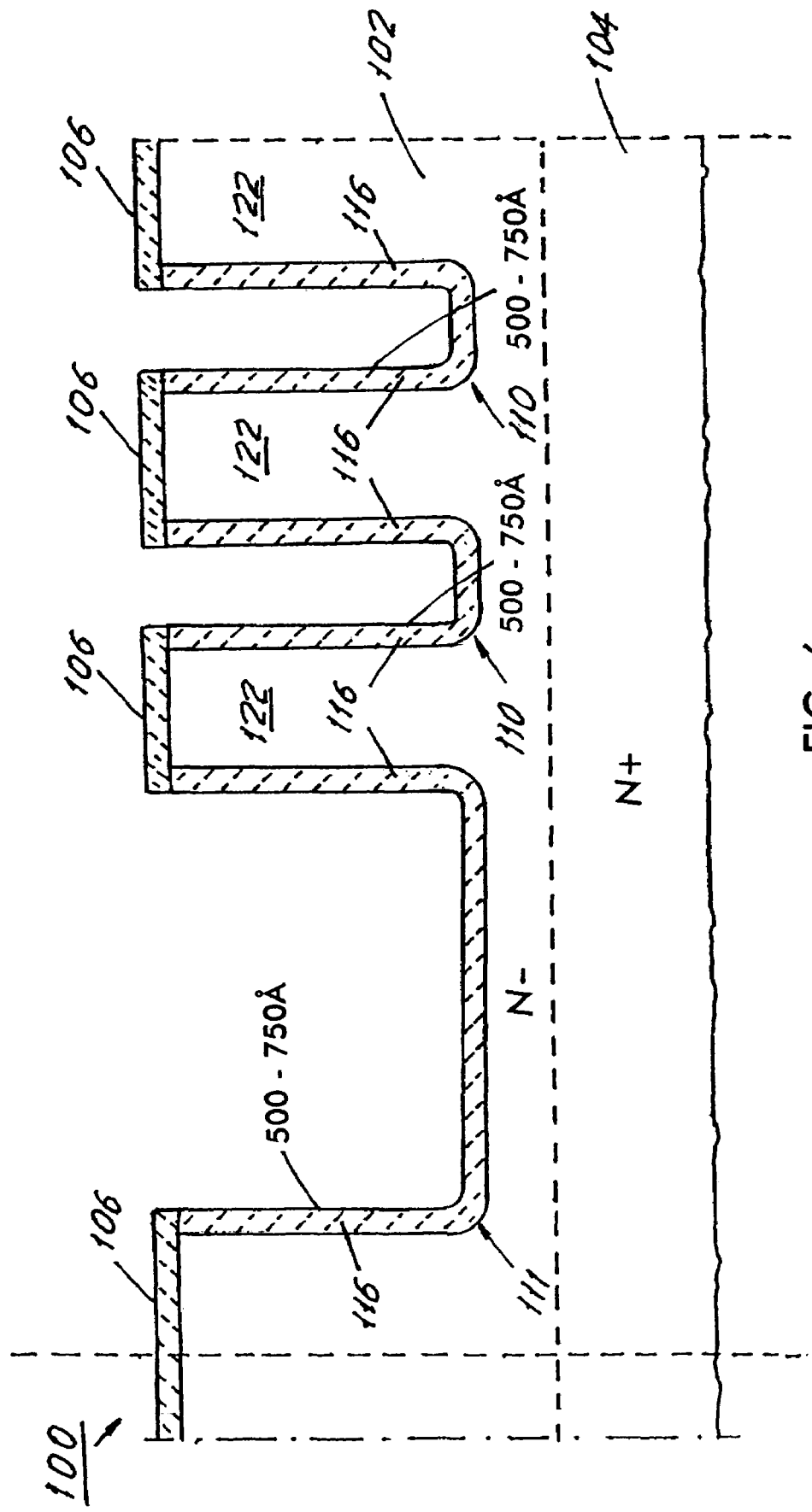
FIG. 6 shows the structure of FIG. 5 after the growth of an initial gate oxide/termination oxide layer along the sidewall and bottom surfaces of the trenches.

Next, according to the present invention and as shown in FIG. 6, a uniform oxide layer 116 is simultaneously grown to a thickness of approximately 500-750 Å on the sidewall and bottom surfaces of trenches 110 and 111 using a wet or dry process, thereby forming a gate oxide and termination oxide, respectively. Note that the preferred ratio of the sacrificial oxide thickness to the gate oxide thickness, grown at this step, is 2:1

$$\left(\text{i.e., } \frac{sacrificial-oxide-thickness}{gate-oxide-thickness} = 2\right).$$

Figure 7:
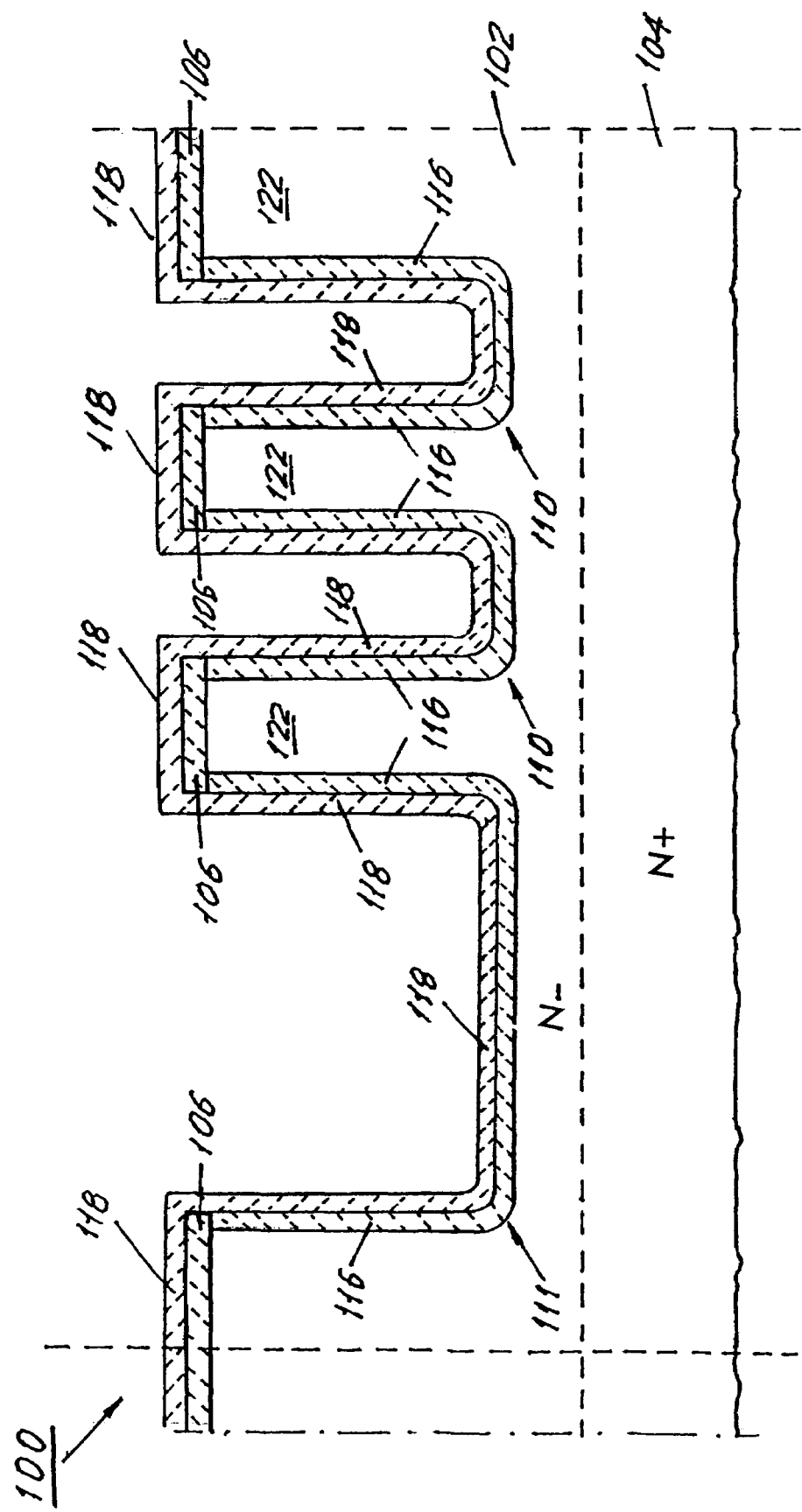
FIG. 7 shows the structure of FIG. 6 after the formation of a second nitride layer that covers the first nitride layer and the sidewall and bottom surfaces of the trenches.
Figure 8:
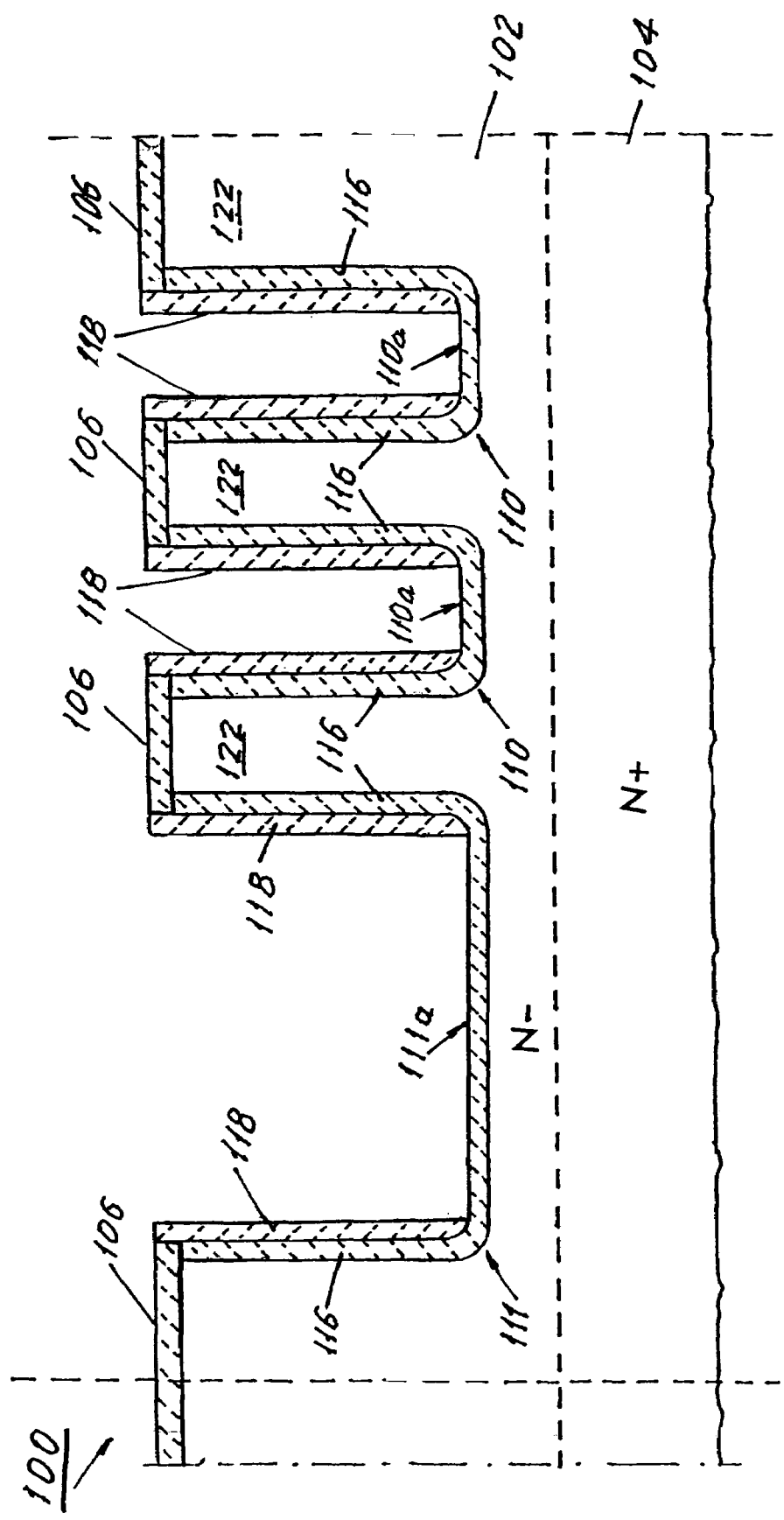
FIG. 8 shows the structure of FIG. 7 after a dry etch of the second nitride layer, resulting in the exposure of the oxide layer along the bottom surface of the trenches.

As shown in FIG. 7, a removable trench nitride layer 118 is then deposited at a thickness of approximately 150-200 Å over surface nitride layer 106 and over oxide layer 116 along the sidewall and bottom surfaces of trenches 110 and 111 using for example, a low-pressure chemical vapor deposition technique (LPCVD). Using a dry nitride etch, trench nitride layer 118 is then removed from surface nitride layer 106, from bottom surface 110a of trenches 110, and from bottom surface or field region 111a of termination trench 111, thereby effectively applying the trench nitride layer to only the sidewall of each trench, as shown in FIG. 8. As such, oxide layer 116 is now exposed only along the bottom surfaces 110a and 111a of trenches 110 and 111, respectively.

Figure 9:
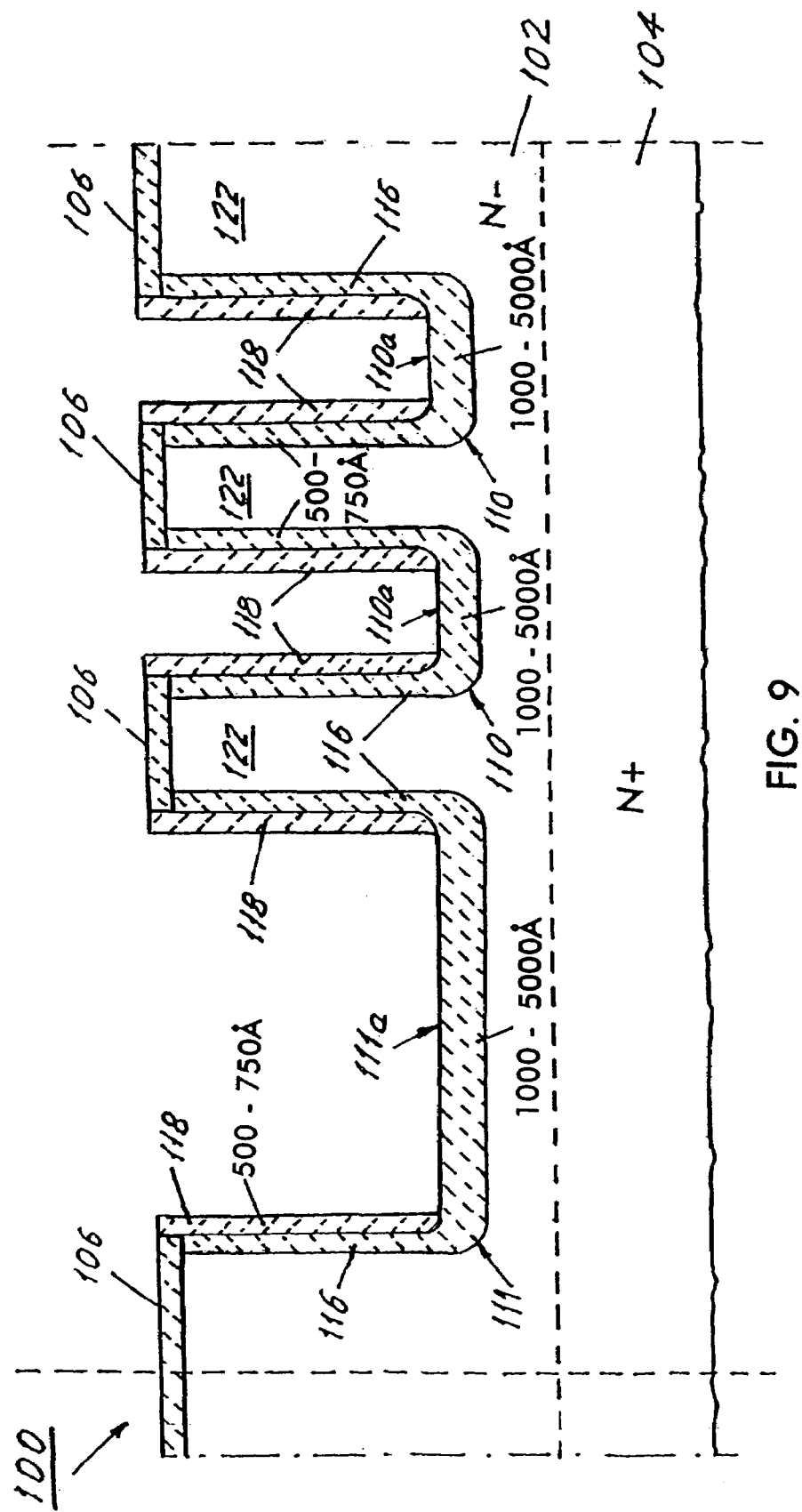
FIG. 9 shows the structure of FIG. 8 after the further growth of the gate oxide/termination oxide layer along the bottom surface of the trenches.
Figure 10:
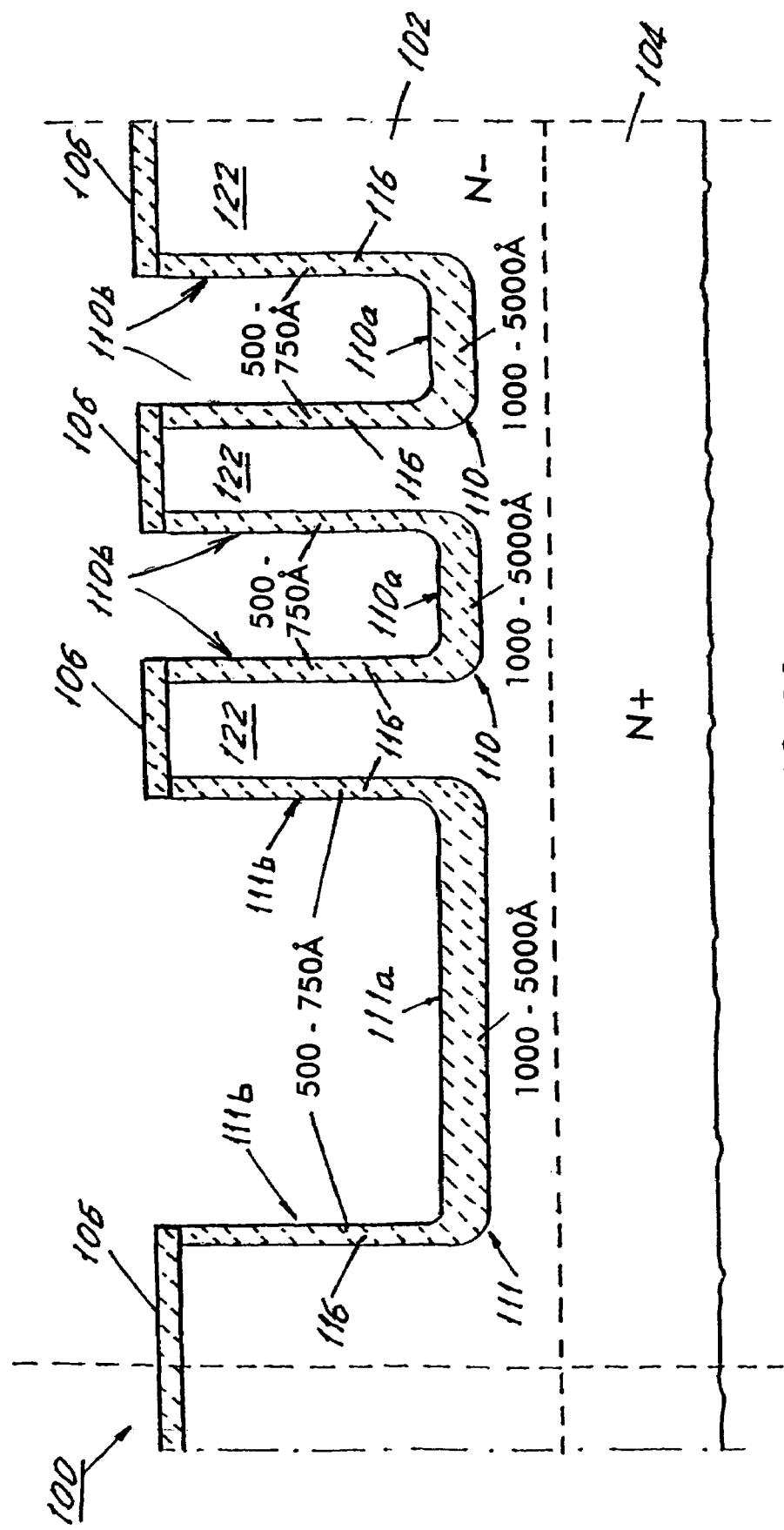
FIG. 10 shows the structure of FIG. 9 after the second nitride layer is completely removed, resulting in a differential trench oxide layer in which the oxide layer on the trench sidewalls is thinner than the oxide layer along the trench bottom surfaces.

Accordingly, exposed oxide layer 116 along trench bottom surfaces 110a and 111a is next grown to a total thickness of approximately 1000-5000 Å using a wet or dry process, as shown in FIG. 9. A wet nitride etch, for example phosphoric acid at 150° C., and at a target nitride removal of 200-250 Å is next performed to strip the remaining trench nitride layer 118 covering the sidewall of trenches 110 and 111. As such, according to the present invention and as shown in FIG. 10, oxide layer 116 lining trenches 110 and 111 now has a differential or varying thickness, with the oxide layer lining sidewalls 110b and 111b of trenches 110 and 111, respectively, being thinner than the oxide layer lining bottom surfaces 110a and 111a.

Again, note that the above oxide thicknesses are for example purposes only and one skilled in the art will recognize that other oxide thicknesses can be used to produce devices with different ratings without deviating from the present invention.

Figure 11:
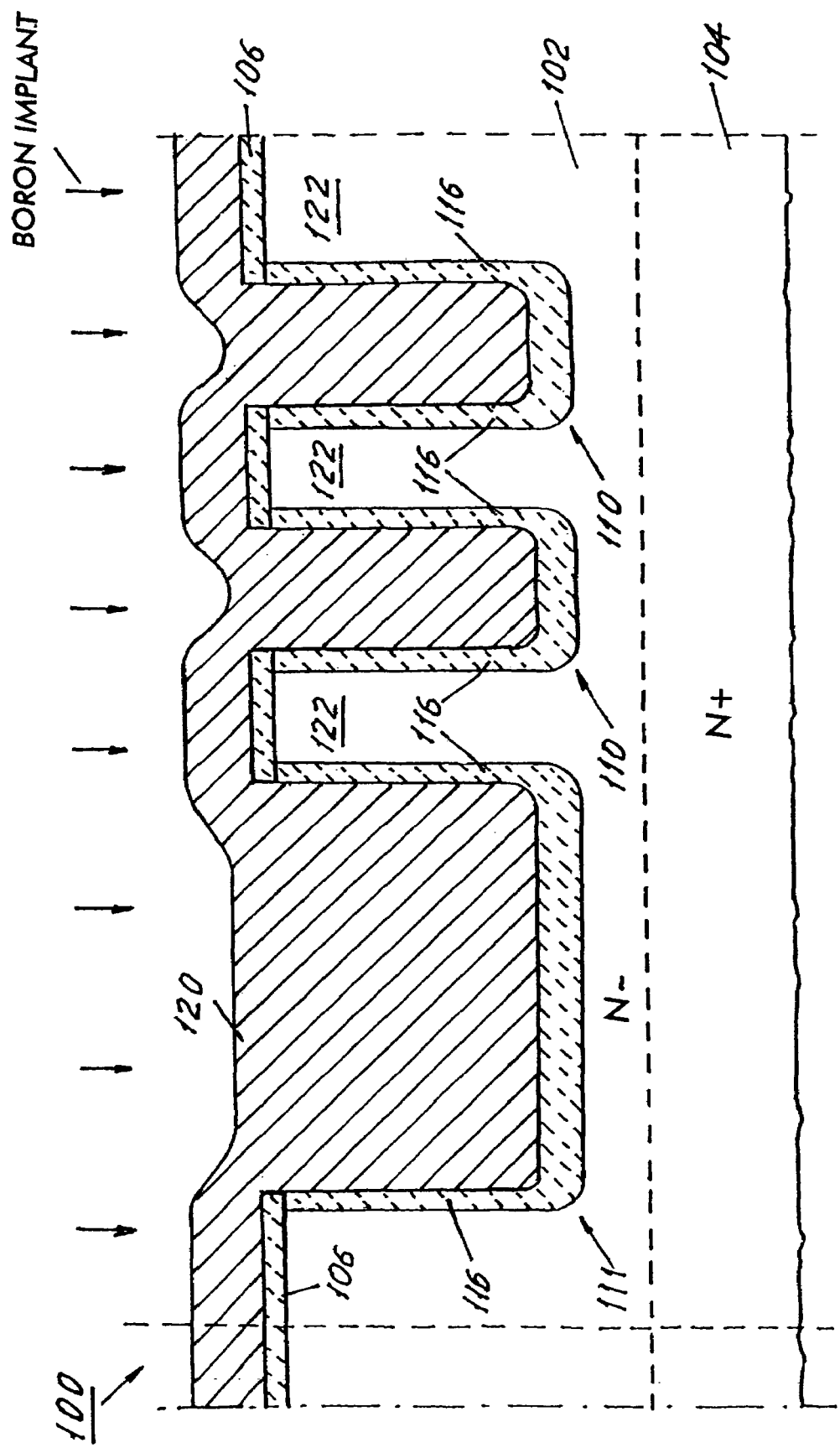
FIG. 11 shows the structure of FIG. 10 after the deposition of a polysilicon layer that fills the trenches, and after a subsequent boron implant into the polysilicon layer.

Turning to FIG. 11, a layer of an un-doped polysilicon 120 is next deposited on the surface of the above structure to a thickness of approximately 7500 Å to fill trenches 110 and 111. A boron implant, for example $1E14/cm^2$ at 80 kev, is then applied to the surface of the structure. Nonetheless, one skilled in the art will recognize that any implant species that acts as a P-type dopant can be used. Among these dopants, Boron or $BF_2$ are the most common.

Then, after yet another pre-diffusion clean, the implanted species are activated and driven at 1050° C. for one hour to make the polysilicon P type conductive within the trenches. As a result, a plurality of electrodes are now formed within the trenches and between the mesas.

Figure 12:
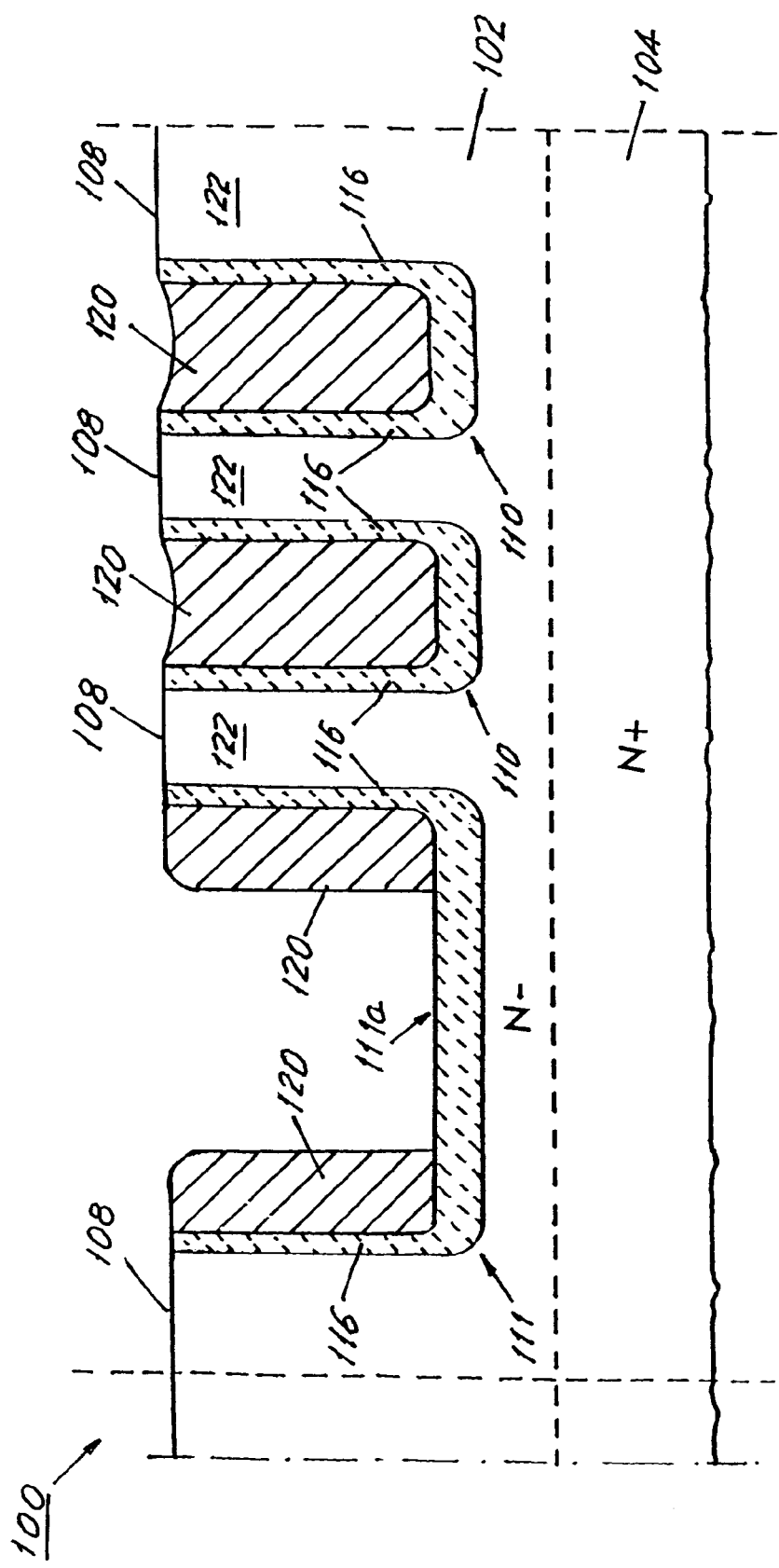
FIG. 12 shows the structure of FIG. 11 after an etch of the polysilicon layer.

Next, a blanket poly etch is carried out by a suitable plasma etcher for a period of time lasting for at least five more seconds than would be necessary to remove the polysilicon on the device surface. A suitable mask is then applied and a portion of the polysilicon along the bottom surface 111a or field region of termination trench 111 is removed. Following these steps, the remaining surface nitride layer 106 covering mesa regions 122 is stripped by a wet etch in phosphoric acid at 150° C. The resulting structure is shown in FIG. 12.

Figure 13:
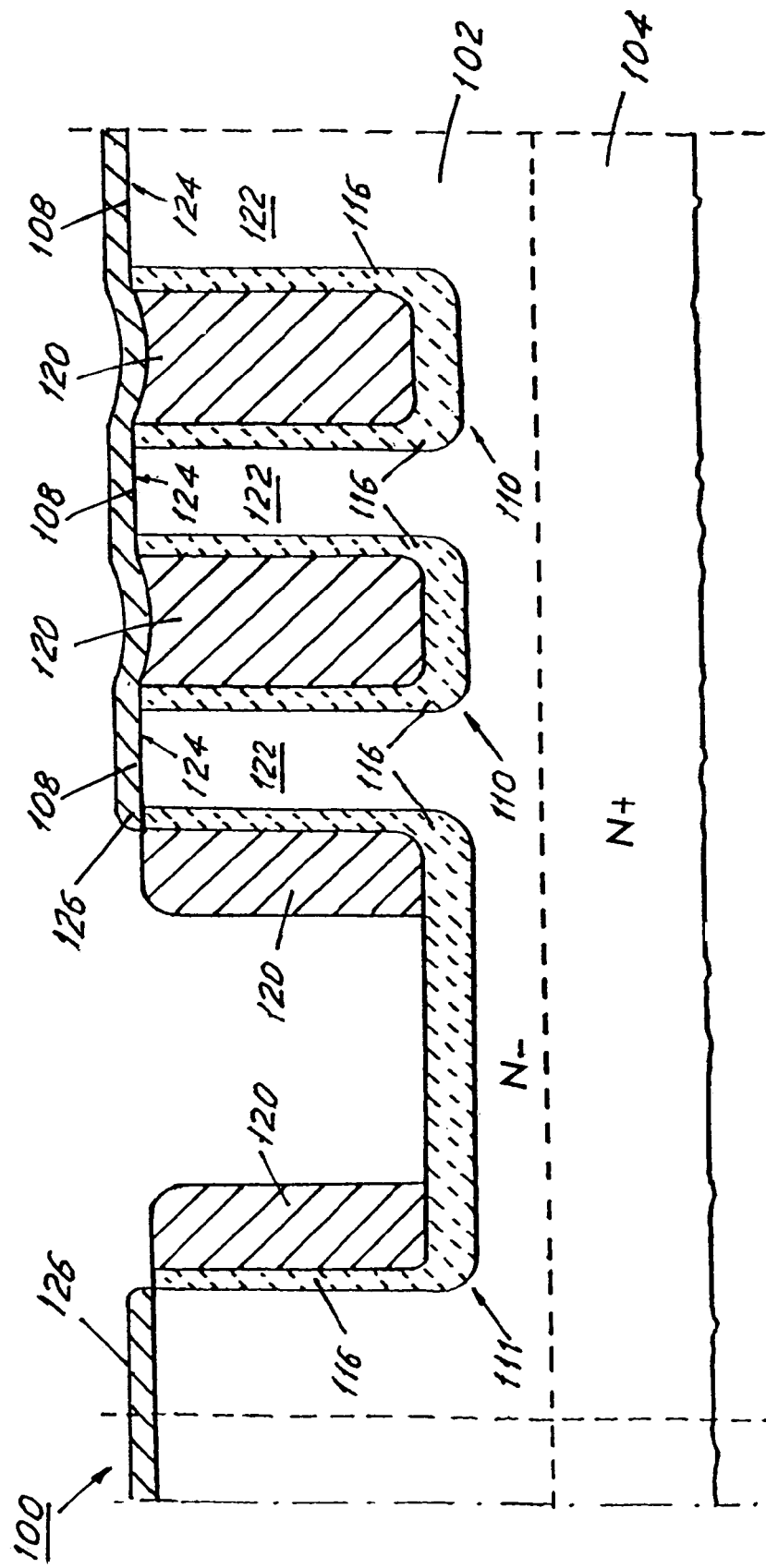
FIG. 13 shows the structure of FIG. 12 after the deposition of a barrier metal layer, the annealing of the barrier metal to form Schottky contacts over the active region, and the etching of the un-reacted barrier metal over the termination trench.

Next, referring to FIG. 13, top face 108 of the structure is cleaned using any desired pre-metal clean. A barrier metal 126, such as titanium (Ti) or titanium-tungsten (TiW), etc. is next sputtered on surface 108. In general, the titanium layer can be applied at any thickness but preferably, the titanium layer is about 600 Å thick to maximize the thickness of the subsequent silicide layer and to minimize the thickness of the un-reacted titanium. Note also that any technique can be used for the titanium deposition, with sputtering and electron beam evaporation being the most common techniques.

Next, the layer of titanium is annealed at a high temperature in an inert atmosphere. As a consequence, the thin titanium layer reacts with the active-device region to form a titanium silicide layer over the active region, forming Schottky contacts 124 that extend over the tops of mesa regions 122. The non-reacted titanium layer extending along the termination trench 111 is then removed by etching the structure with any known Ammonium Hydroxide and Hydrogen Peroxide-based solution. In general, etch time can vary, but etch temperature should not exceed 80° C. to avoid excessively fast decomposition of the $H_2O_2$. The resulting structure is shown in FIG. 13.

Figure 14:
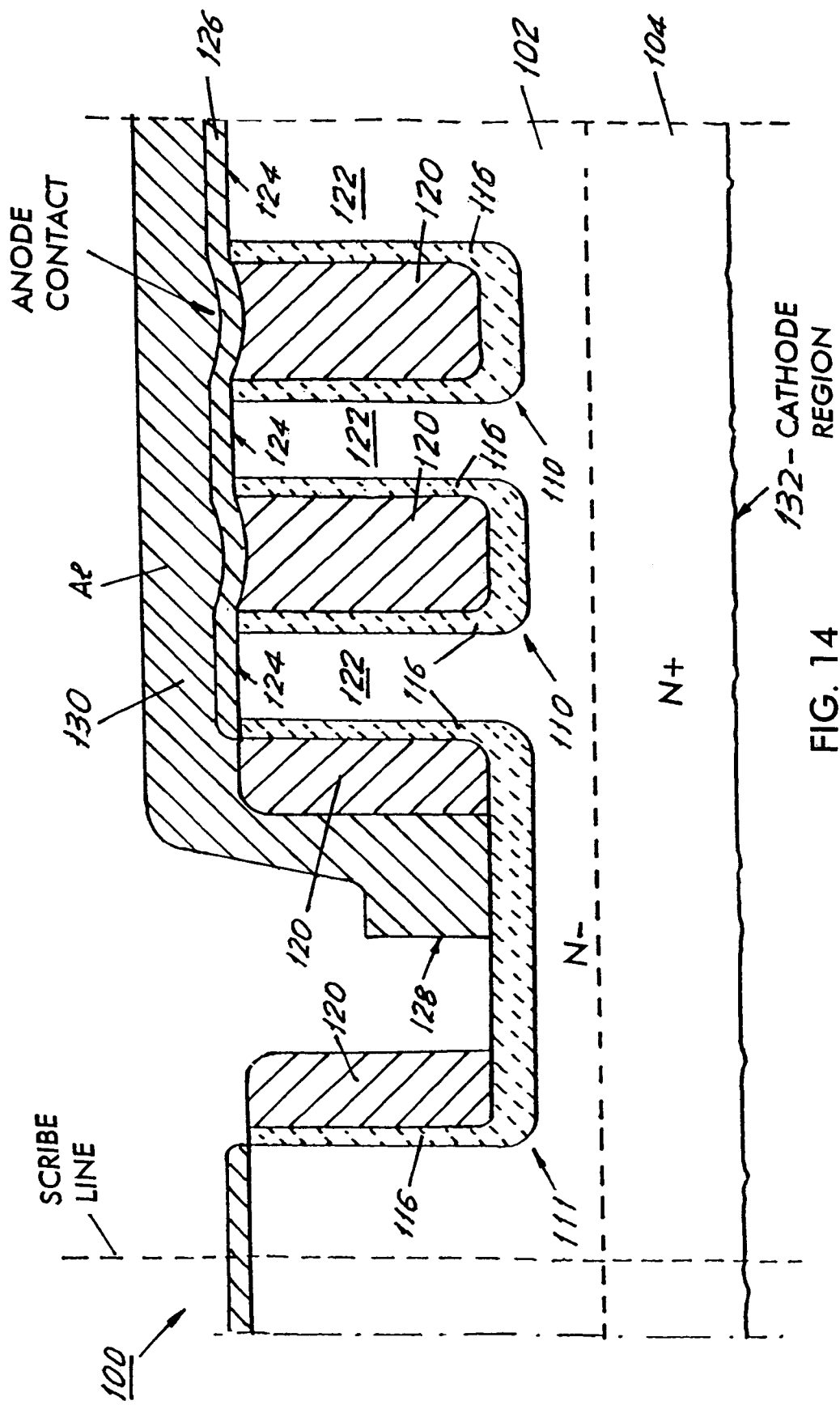
FIG. 14 shows the structure of FIG. 13 after the deposition of an anode contact metal layer and the partial etching of this layer within the termination trench.

As seen in FIG. 14, an anode contact metal layer 130, which may be a layer of aluminum or other conductive metal layer, is next deposited on the top of the structure. A metal mask (not shown) is then applied and contact metal layer 130 is partially etched within the termination trench 111 thereby leaving only a peripheral portion 128 of the metal in this region.

Finally, the entire wafer is attached to a frame of a grinding device (not shown) via an adhesive tape and a back-grind is carried out, thinning the wafer to 8 mils, after which the work piece is de-taped and etched to smooth out roughened surfaces as a result of grinding. A backside metal, such as a trimetal (Ti/Ni/Ag), is then sputtered on the bottom 132 of the wafer to form a cathode electrode on the bottom surface of the Schottky rectifier. The wafer may then be diced along scribe lines to separate a plurality of identical diodes.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A method for fabricating a trench Schottky rectifier with varying oxide thickness, comprising the steps of:
    etching a face of a silicon substrate having a first conductivity type to form a plurality of spaced trenches extending downward from the face into the silicon substrate;
    growing an oxide layer on sidewall and bottom surfaces of each of said plurality of trenches;
    depositing a trench nitride layer over at least the oxide layer lining the sidewall and bottom surfaces of each of said plurality of trenches;
    etching the trench nitride layer to expose for each of said plurality of trenches the oxide layer lining at least the bottom surface of the trench;
    continuing to grow for each of said plurality of trenches the oxide layer lining the bottom surface of the trench;
    stripping the trench nitride layer to expose for each of said plurality of trenches the oxide layer lining the sidewall surface, thereby forming an oxide layer of varying thicknesses along the sidewall and bottom surfaces respectively of each trench; and
    forming a Schottky metal layer atop the face of said silicon substrate such that the Schottky metal layer forms a Schottky rectifier contact in mesa regions between the plurality of trenches.

2. The method of claim 1, further comprising prior to said silicon substrate etching step, the steps of:
    depositing a surface nitride layer directly on the face of the silicon substrate;
    patterning the surface nitride layer to define a trench pattern; and
    using the pattern for etching the plurality of spaced trenches.

3. The method of claim 2, wherein said trench nitride layer depositing step also deposits the trench nitride layer over the surface nitride layer and wherein said trench nitride layer etching step also removes the trench nitride layer from the surface nitride layer.

4. The method of claim 2, wherein the surface nitride layer depositing step deposits the surface nitride layer at a thickness of approximately 600 to 800 Å and wherein the trench nitride layer depositing step deposits the trench nitride layer at a thickness of approximately 150 to 200 Å.

5. The method of claim 4, wherein said trench nitride layer stripping step has a target nitride removal thickness of approximately 200 to 250 Å.

6. The method of claim 1, wherein a termination trench is etched in the face of the silicon substrate simultaneously with the etching of the plurality of trenches and wherein an oxide layer of varying thicknesses along the sidewall and bottom surfaces respectively of the termination trench is formed simultaneously when forming the oxide layer of varying thicknesses along the sidewall and bottom surfaces of the plurality of trenches.

7. The method of claim 6, wherein said first oxide layer growing step grows the oxide layer on the sidewall and bottom surfaces of each of said plurality of trenches and on the sidewall and bottom surfaces of the termination trench to approximately 500 to 750 Å and wherein said second oxide layer growing step grows the oxide layer on the bottom surface of each of said plurality of trenches and on the bottom surface of the termination trench to a total thickness of approximately 1000 to 5000 Å.

8. The method of claim 6, further comprising:
    after said stripping step the step of:
    filling the plurality of trenches with a conductive material of a second conductivity type; and
    after said Schottky metal forming step the step of:
    depositing an anode contact metal atop the Schottky metal layer and extending to the termination trench such that the anode contact metal covers a portion of the oxide layer on the bottom surface of the termination trench.

9. The method of claim 1, wherein said first oxide layer growing step grows the oxide layer on the sidewall and bottom surfaces of each of said plurality of trenches to approximately 500 to 750 Å.

10. The method of claim 9, wherein said second oxide layer growing step grows the oxide layer on the bottom surface of each of said plurality of trenches to a total thickness of approximately 1000 to 5000 Å.

11. The method of claim 1, further comprising prior to said first oxide layer growing step the steps of:
    growing a sacrificial oxide layer on the sidewall and bottom surfaces of each of said plurality of trenches; and
    stripping the sacrificial oxide layer from the sidewall and bottom surfaces of each of said plurality of trenches.

12. The method of claim 11, wherein said sacrificial oxide layer growing step grows the sacrificial oxide layer to a thickness that is two times greater than a thickness to which said first oxide layer growing step grows the oxide layer on the sidewall and bottom surfaces of each of said plurality of trenches.

13. The method of claim 12, wherein the thickness of the sacrificial oxide layer is approximately 1000 to 1500 Å.

14. The method of claim 13, wherein said sacrificial oxide layer stripping step has a target oxide removal of approximately 1500 to 2000 Å.

15. A method for fabricating a trench Schottky rectifier with varying oxide thickness, comprising the steps of:
    etching a face of a silicon substrate having a first conductivity type to form a plurality of spaced trenches extending downward from the face into the silicon substrate;
    growing an oxide layer on sidewall and bottom surfaces of each of said plurality of trenches;
    depositing a trench nitride layer over at least the oxide layer lining the sidewall and bottom surfaces of each of said plurality of trenches;
    etching the trench nitride layer to expose for each of said plurality of trenches the oxide layer lining at least the bottom surface of the trench;
    continuing to grow for each of said plurality of trenches the oxide layer lining the bottom surface of the trench; and
    stripping the trench nitride layer to expose for each of said plurality of trenches the oxide layer lining the sidewall surface, thereby forming an oxide layer of varying thicknesses along the sidewall and bottom surfaces respectively of each trench,
    further comprising after said stripping step the steps of:
    filling the plurality of trenches with a conductive material of a second conductivity type; and
    forming a Schottky metal layer atop the face of said silicon substrate such that the Schottky metal layer forms a Schottky rectifier contact in mesa regions between the plurality of trenches.

16. A method of forming a trench Schottky barrier device, comprising the steps of:
 forming a first nitride layer on one of opposite faces of a semiconductor substrate having a first conductivity;
 patterning the first nitride layer to define a trench pattern;
 using the trench pattern to etch through the first nitride layer and through regions of the one face of the semiconductor substrate to form alternating trenches and mesas in the semiconductor substrate;
 forming an oxide layer on bottom and sidewall surfaces of each trench;
 forming a second nitride layer over at least the bottom and sidewall surfaces of each trench;
 etching the second nitride layer to expose at least the oxide layer lining the bottom surface of each trench;
 continuing to form the oxide layer lining the bottom surface of each trench such that for each trench, the bottom surface oxide layer varies in thickness from the sidewall surface oxide layer;
 stripping the second nitride layer on the sidewall of each trench to expose the oxide layer lining the sidewall surface;
 filling the trenches with a conductive material of a second conductivity type;
 stripping the first nitride layer overlaying the mesas to expose the semiconductor substrate; and
 applying a continuous barrier layer over the one face to form a Schottky rectifier contact between the exposed portion of the semiconductor substrate of the mesas and the barrier layer.

17. The method of claim 16, wherein a termination region, with an oxide layer that varies in thickness between bottom and sidewall surfaces of the termination region, is formed simultaneously with the trenches.

\* \* \* \* \*